(12) United States Patent  
Tatt et al.

(10) Patent No.: US 7,795,712 B2
(45) Date of Patent: Sep. 14, 2010

(54) LEAD FRAME WITH NON-CONDUCTIVE CONNECTIVE BAR

(75) Inventors: Alvin Wee Beng Tatt, Melaka (MY); Fuaida Harun, Sha Alam (MY); Soon Hock Tong, Melaka (MY); Robert-Christian Hagen, Sarching (DE); Yang Hong Heng, Johor (MY); Kean Cheong Lee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 60 days.

(21) Appl. No.: 12/204,493

(22) Filed: Sep. 4, 2008

(65) Prior Publication Data

US 2009/0051017 A1 Feb. 26, 2009

Related U.S. Application Data

(63) Continuation of application No. PCT/IB2006/000702, filed on Mar. 28, 2006.

(51) Int. Cl.
 *H01L 23/495* (2006.01)
 *H01L 23/28* (2006.01)
(52) U.S. Cl. .................. 257/675; 257/676; 257/670; 257/796; 257/E23.037; 257/E23.05
(58) Field of Classification Search .............. 257/670, 257/675, 676, 796, E23.037, E23.05
See application file for complete search history.

(56) References Cited

U.S. PATENT DOCUMENTS

| 4,507,675 | A |   | 3/1985  | Fujii et al.     |         |
|-----------|---|---|---------|------------------|---------|
| 4,649,637 | A | * | 3/1987  | Hatakeyama       | 29/827  |
| 4,768,077 | A |   | 8/1988  | Scherer          |         |
| 5,049,055 | A | * | 9/1991  | Yokoyama         | 425/116 |
| 5,427,938 | A | * | 6/1995  | Matsumura et al. | 264/272.17 |
| 6,821,822 | B1 |  | 11/2004 | Sato             |         |

FOREIGN PATENT DOCUMENTS

| EP | 1408548 A2 | 4/2004 |
| JP | 2003324116 | 11/2003 |
| WO | 8705153 | 8/1987 |

* cited by examiner

*Primary Examiner*—Luan C Thai
(74) *Attorney, Agent, or Firm*—Edell, Shapiro & Finnan, LLC

(57) ABSTRACT

An electronic component includes a lead frame, a semiconductor chip and an encapsulating body. The lead frame includes a heat spreader area, a plurality of conductive lead fingers, at least one non-conductive tie bar, and a metal joint. The metal joint connects the at least one non-conductive tie bar to the heat spreader area. The semiconductor chip is provided on a die pad located on the heat spreader area. The encapsulating body covers at least part of the semiconductor chip, at least part of the at least one non-conductive tie bar and part of the lead frame.

18 Claims, 3 Drawing Sheets

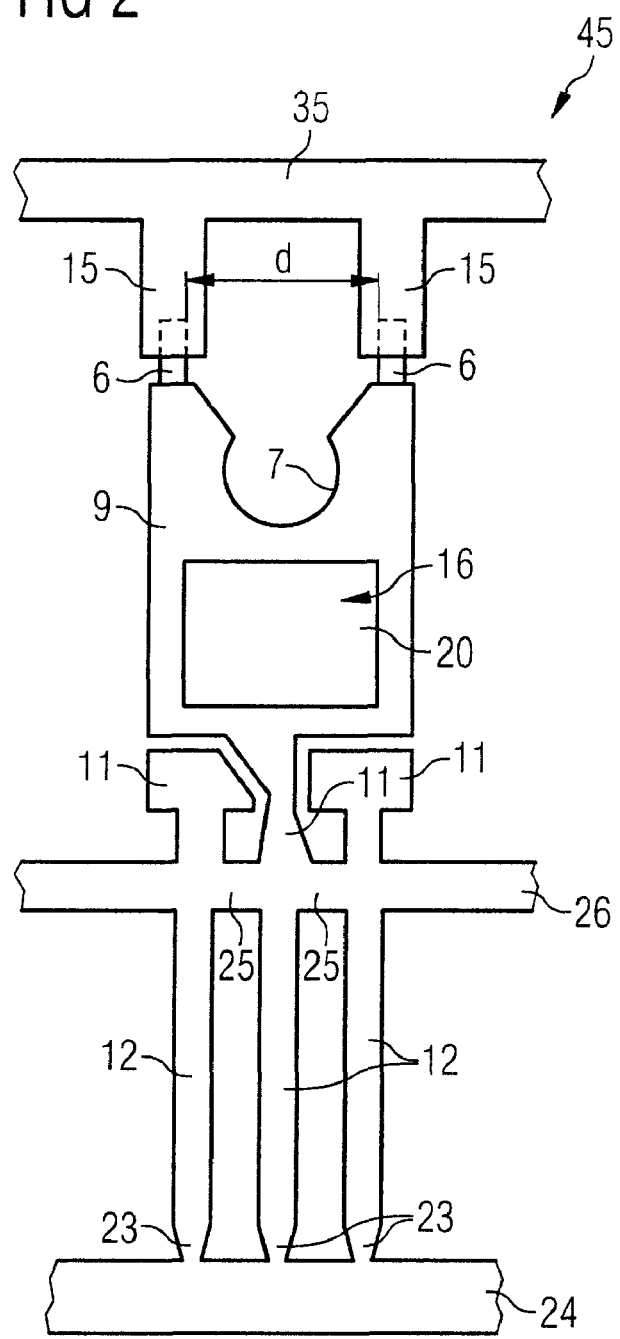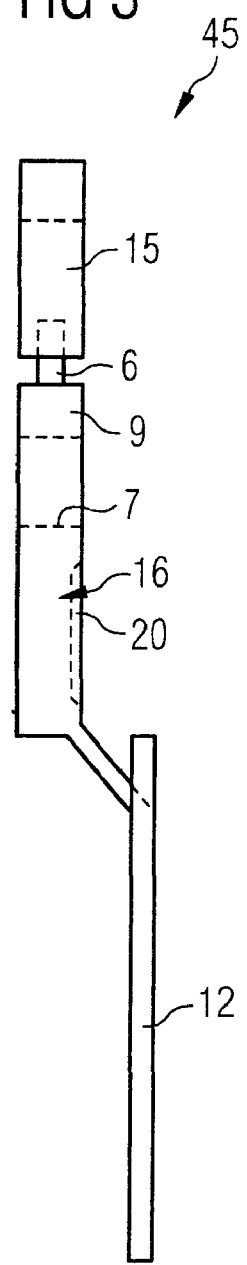

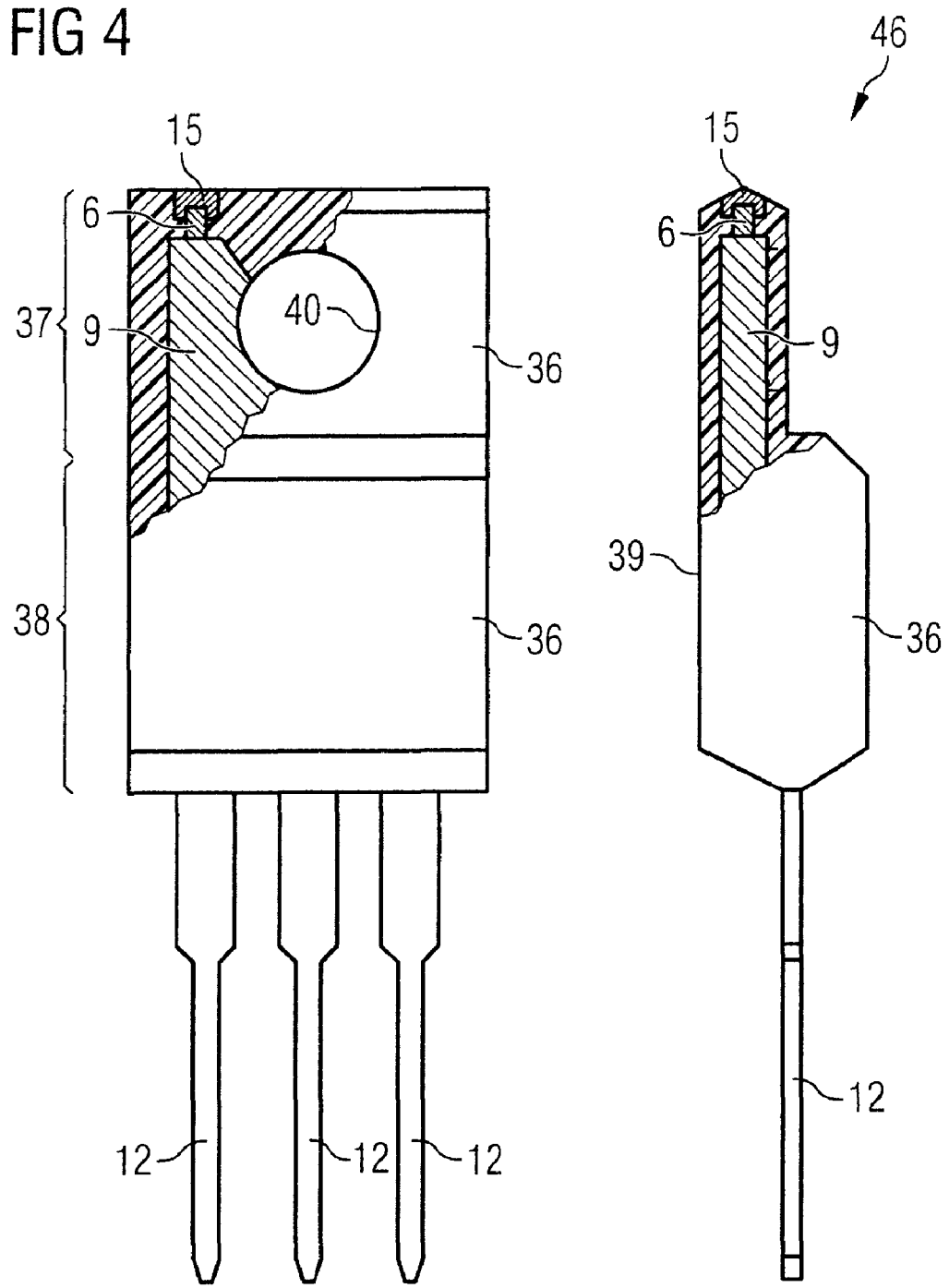

LEAD FRAME WITH NON-CONDUCTIVE CONNECTIVE BAR

CROSS REFERENCE TO RELATED APPLICATIONS

This application is a continuation of International Application No. PCT/IB2006/000702, filed on Mar. 28, 2006, entitled "Lead Frame with Non-Conductive Connective Bar," the entire contents of which are hereby incorporated by reference.

BACKGROUND

In known methods of molding a semiconductor chip, one or more support pins are used to enter a mold cavity to support a lead frame during a mold encapsulation process. The support pin is removed from the mold assembly as the encapsulation compound starts to harden. This method suffers in that the movement of the support pin within the molten encapsulation compound causes severe wear of the support pin, which, in turn entails replacement cost. Moreover, support pins may interfere with the flow of the molten encapsulation compound within the mold cavity.

SUMMARY

An electronic component with a lead frame and a method of encapsulating a semiconductor chip are described herein. The lead frame includes a heat spreader area, a plurality of conductive lead fingers, at least one non-conductive tie bar, and a metal joint connecting the at least one non-conductive tie bar to the heat spreader area. The electronic component further comprises a semiconductor chip that is provided on a die pad located on the heat spreader area of the lead frame. In addition, the electronic component also includes an encapsulating body covering at least part of the semiconductor chip, at least part of the at least one non-conductive tie bar and part of the lead frame.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The electronic component and method of encapsulating a semiconductor chip are explained in more detail below with reference to accompanying drawings, where:

FIG. 2 shows a top view of an example of a lead frame assembly according to an embodiment;

FIG. 3 shows a side view of the lead frame assembly of FIG. 2; and

FIG. 4 shows an electronic component produced with the mold assembly of FIG. 1 in accordance to the method of encapsulating.

DETAILED DESCRIPTION

Figure 1:
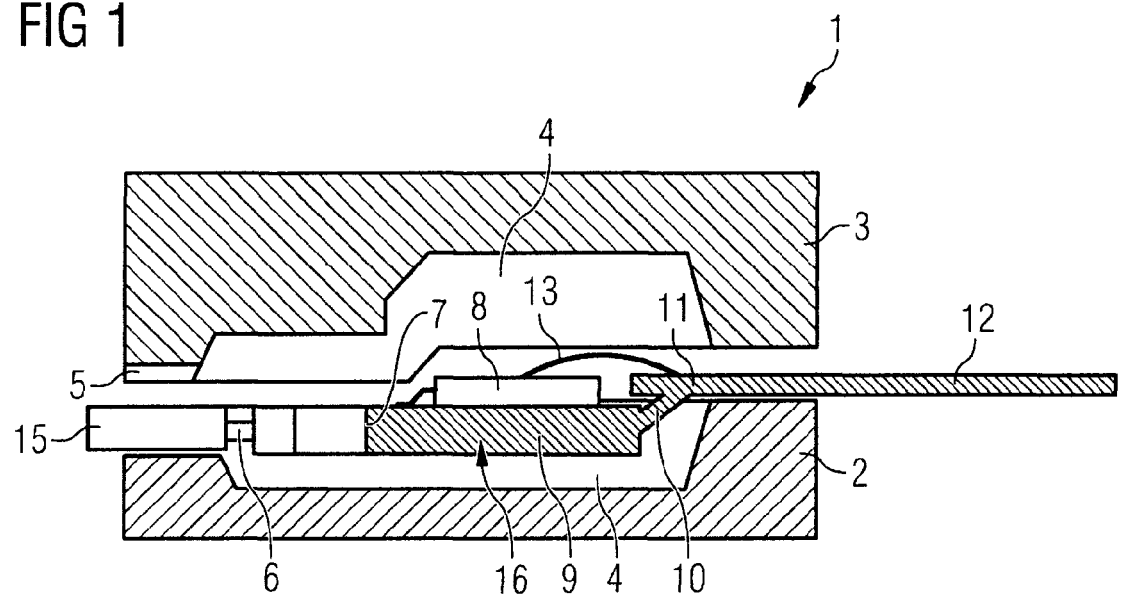
FIG. 1 shows a cross section view of an example of a mold assembly according to an embodiment.

Described herein is an improved method for encapsulating a semiconductor chip and in particular, an improved method of encapsulation for a single-ended package.

According to an embodiment, an electronic component comprises a lead frame. The lead frame includes a die paddle which serves as a heat spreader area, conductive fingers and non-conductive tie bars which may have the shape of lead fingers. The non-conductive tie bars can be produced, for example, from foil or as a separately molded plastic component. Metal joints are provided at the heat spreader area as metal links for connecting the non-conductive tie bars with the heat spreader area.

A semiconductor chip is located on a die pad that is provided on the die paddle. An encapsulating compound covers the semiconductor chip, at least part of the non-conductive tie bars and part of the lead frame. According to an embodiment of the method, the addition of the non-conductive lead fingers (i.e., tie bars) to the electronic component enhances stability of the lead frame during the package encapsulation process.

The electronic component according to an embodiment comprises metal joints or metal links that are covered by electrically insulating mold compound. Metal joints may comprise a material (e.g., copper) which tends to corrode when exposed. Moreover, covering the metal joints prevents any external electrical signal from reaching the semiconductor chip via the metal joint.

According to an embodiment, the non-conductive tie bars are attached to a connective frame which serves as a connective bar. This connective frame aids in keeping the non-conductive lead fingers (i.e., tie bars) from shifting during production process. Handling during the production process could otherwise shift the non-conductive tie bars and render it ineffective during the molding process.

According to an embodiment, the connective frame is made of a rigid material. The rigidity of the connective frame or connective bar aids the lead frame from moving during the manufacturing process. To maintain rigidity, the connective bar optionally comprises a thermoplastic material. The connective bar optionally has a thickness of more than 0.5 millimeters (mm). The non-conductive lead fingers (i.e., tie bars) of the connective frame are optionally less than 10 mm from each other.

An electronic component, according to an embodiment, the surfaces of the non-conductive tie bars are flat or flush with or in a same plane as the surface of the encapsulation compound of the electronic component. The non-conductive tie bars protrude outside the encapsulation compound during the molding process. After the molding process, the protruding portions of the non-conductive tie bars are removed.

According to an embodiment, the non-conductive tie bar comprises a material that has a melting point greater than 200 degrees Celsius (° C.). The non-conductive tie bar is surrounded by molten encapsulation compound during the package encapsulation process. The high melting point of the non-conductive tie bar enables the non-conductive tie bar to tolerate the molten encapsulation compound. Molten encapsulation compound has a melting point of about 175° C.

According to an embodiment, the non-conductive tie bar comprises a rigid material. The rigid non-conductive tie bar aids in securing the lead frame from shifting during the molding process.

According to an embodiment of the electronic component, the conductive lead fingers are disposed at one side of the electronic component. The conductive lead fingers support the lead frame during the molding process. However, a lead frame with conductive lead fingers disposed at only one side of the lead frame is prone to movement during the package encapsulation process. According to an embodiment of the method, lead frame stability is enhanced by providing non-conductive tie bars, which serve as anchor points for securing the lead frame during the molding process.

A method of fabricating an electronic component comprises the step of forming a non-conductive tie bar over a metal joint of a lead frame, the metal link or metal joint being optionally located at a heat spreader area of the lead frame. Subsequently, a semiconductor chip is attached to a die pad of the lead frame via, for example, an adhesive. Thereafter, electrical contacts (e.g., bond wires) are provided between contact areas of the semiconductor chip and bonding fingers of the lead frame. The method further includes package encapsulation where the semiconductor chip, the non-conductive lead fingers and the lead frame are covered with an encapsulating compound. Following this, the protruding portions of the non-conductive tie bars (i.e., portions of the tie bars that protrude out of the surface of the encapsulated body) are removed such that the surface of the non-conductive tie bars is flat or flush with (i.e., in a same plane as) an outer surface of the encapsulated body.

Non-conductive tie bars are optionally formed on the metal joints of a bare lead frame. Forming non-conductive tie bars on the metal link (i.e., metal joint) after the step of providing electrical contact between the bonding finger and the contact areas of the semiconductor chip may disturb the electrical contacts.

According to an embodiment, the method of fabricating an electronic component further comprises clamping conductive lead fingers of the lead frame by a mold assembly during the package encapsulation. Clamping the conductive lead fingers prevents the conductive lead fingers from moving. This in turn keeps the lead frame that is attached to the conductive lead fingers from moving. Molten encapsulation compound is injected into the mold cavity during the package encapsulation process. The flowing molten encapsulation compound exerts a shifting force on the lead frame but the clamped lead fingers keep the lead frame from moving. This differs from known methods where support pins are used to enter the mold cavity to keep the lead frame from moving.

According to an optional embodiment, the method of fabricating, involves clamping the non-conductive tie bars of the lead frame by a mold assembly during the package encapsulation. Clamping the non-conductive tie bars keeps the non-conductive lead fingers or tie bars fixed and therefore enhances the stability of the lead frame during the molding process.

In the following paragraphs, exemplary embodiments of the electronic component and method of encapsulating a semiconductor chip are described in connection with the figures.

FIG. 1 shows a cross section view of a mold assembly 1. The mold assembly 1 comprises a lower mold 2 and an upper mold 3 on top of the lower mold 2. The space between the lower mold 2 and the upper mold 3 constitutes a mold cavity 4. A gate 5 is formed as a canal on the peripheral of the left side of the upper mold 3.

Within the mold cavity 4 there is provided a metal lead frame 16 with a semiconductor chip 8. The lead frame 16 is supported by a connective frame 35 which comprises non-conductive tie bars 15.

The lead frame 16 comprises a heat spreader area 9 (i.e., die paddle) with a mounting hole 7, metal joints 6, a metal tie bar 10, bonding fingers 11 and lead fingers 12 and non-conductive tie bars 15. The metal tie bar 10 is located on the right side of the die paddle 9 in FIG. 1 and it interconnects the heat spreader area 9 and the bonding fingers 11. Each bonding finger 11 comprises a lead finger 12. The lead fingers 12 are connected to each other by metal link areas 25, which can be best seen in FIG. 2.

Metal joints 6 are located on the left of the heat spreader area 9, the metal joints 6 can be shaped with a punching or stamping process, for example, when producing the lead frame 16. Each metal joint 6 is connected to a non-conductive tie bar 15. The connection can be made with a bonded area, using adhesive, for example. There can be provided with meshing dents or protrusions both at the metal joint 6 and the non-conductive tie bar 15 to increase the contact regions between them.

The semiconductor chip 8 is arranged over the heat spreader area 9. The semiconductor chip 8 comprises electrical circuitry and a plurality of connection pads connected to the electrical circuitry. For simplicity, the electrical circuitry and the connection pads are not shown in FIG. 1. Contact means 13 (e.g., bond wires) connect the connection pads of the semiconductor chip 8 to the bonding fingers 11 of the lead frame 16.

The lead frame 16 is arranged laterally over the lower mold 2.

The heat spreader area 9 is located on the right of the mounting hole 7. The lead fingers 12 are placed over the peripheral of the right side of the lower mold 2 and protrude outside the mold assembly 1.

When the mold assembly 1 of FIG. 1 is in a closed state, the upper mold 3 is tightly placed over the lower mold 2. The peripheral of the upper and lower molds 2 and 3 form a clamp over the lead fingers 12 and over the non-conductive tie bars 15. The gate 5, which is located on the left side of the mold assembly 1, is a passageway for the injection of molten encapsulating compound into the mold cavity 4 to form an encapsulation body over the semiconductor chip 8. The molten compound may be injected via a hydraulic plunger, for example, which is not shown in FIG. 1. The encapsulation compound turns molten at a temperature of about 175° C. As the molten encapsulation compound flows into the mold cavity 4, it cools and increases in viscosity. The rate of flow and the viscosity of the molten encapsulation compound exert a tilting force on the semiconductor chip 8 and the lead frame 16 in the direction of the flow of the encapsulation compound. The semiconductor chip 8 and the lead frame 16 within the mold assembly 1 are anchored against this tilting force by the lead fingers 12 and the connective frame 35 with the non-conductive tie bars 15. The lead fingers 12 and the non-conductive tie bars 15 are connected to the lead frame 16 and are therefore prevented from shifting by the clamping force that the closed mold assembly 1 exerted on the lead fingers 12 and on the non-conductive tie bars 15.

FIG. 2 shows a top view of an example of a lead frame assembly 45 according to an embodiment. The lead frame assembly 45 including a lead frame 16 is used in the mold assembly 1 of FIG. 1. The lead frame 16 comprises a heat spreader area 9 (die paddle). On the die paddle 9, there is provided a mounting hole 7.

Metal joints 6 are a part of the heat spreader area 9 and they are located at the left and right side of the die paddle 9. Non-conductive tie-bars 15 are located over the metal joints 6. The bottom portion of the non-conductive tie bar 15 encloses the top portion of the metal joints 6. The top portion of the non-conductive tie bars 15 are connected to each other by a horizontal connective frame 35. On the front surface of the heat spreader area 9 there is disposed a die pad 20. Bonding fingers 11 extend below the heat spreader area 9. The central bonding finger 11 links the heat spreader area 9 to lead fingers 12. Below each bonding finger 11, there is attached a vertical lead finger 12. At the bottom of the lead fingers 12 there is provided lead tips 23. The lead tips 23 are connected to a horizontal bottom metal strip 24 located below the lead tips 23. Metal links 25 located below the bonding fingers 11 connect the adjacent lead fingers 12 together. The metal links 25 form a horizontal dam bar 26. This lead frame 16 may be part of a lead frame strip, which is not shown in this figure. The lead frame strip comprises, for example, fifteen lead frames 16.

The non-conductive tie bars 15 and the connective frame 35 are made of a thermoplastic material, which is non-conductive. The thickness of the tie-bar may be about 0.7 mm, for example. The separation d between the non-conductive tie bars 15 may be about 7 mm, for example. The mounting hole 7 is intended for a later connection of a heat sink in an end-user application. The die pad 20 is for a later placement of a semiconductor chip. The bonding finger 11 serves as a landing pad for a later connection of a bonding wire between the bonding finger 11 and a contact pad of the semiconductor chip. During a package encapsulation process, molten encapsulating compound covers the top portion of the lead frame 16. The dam bar 26 prevents the molten mold compound from reaching the lead fingers 12 located below the dam bar 26. After the molding process, the metal links 25 between adjacent lead fingers 12, the horizontal connective frame 35, and the horizontal bottom metal strip 24 are all removed. A portion of the non-conductive tie bar 15 protruding out of the encapsulating compound is also removed after the molding process. After removal of the protruding portion, the surface of the non-conductive tie bar 15 is flat or flush with respect to or in a same plane as the surface of the encapsulating compound.

FIG. 3 shows a side view of the lead frame assembly 45 of FIG. 2. The non-conductive tie bars 15 form an attachment on metal joints 6, which are connected to the heat spreader area 9.

FIG. 4 shows an electronic component 46 produced with the mold assembly of FIG. 1 in accordance with an embodiment of the method. FIG. 4 shows a top and side view of the electronic component 46. The top portion of the electronic component 46 shows an encapsulated body 36. The encapsulated body 36 includes an upper portion 37 and a lower portion 38. The thickness of the upper portion 37 is less than the thickness of the lower portion 38. The rear surface 39 of the encapsulated body 36 is flat. The upper portion 37 of the encapsulated body 36 includes a mounting hole 40. Lead fingers 12 are located below the lower portion 38 of the electronic component 46.

The electronic component 46 illustrated in FIG. 4 shows a cut away in the upper left hand corner of the component 46. The cut away portion reveals a cross section view of part of the heat spreader area 9, metal joints 6 and non-conductive tie bar 15. The non-conductive tie bar 15 is made of a non-conductive material. This is unlike lead fingers 12, which are made of a conductive material. Non-conductive tie bars 15 have been cut or removed after the molding process so as to be flush with the surface of the encapsulation body 36.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An electronic component, comprising:
   a lead frame including: a heat spreader area, a plurality of conductive lead fingers, at least two non-conductive tie bars, and at least two metal joints spaced apart from one another, projecting from the heat spreader area, and respectively connecting the at least two non-conductive tie bars to the heat spreader area;
   a semiconductor chip arranged on a die pad located on the heat spreader area; and
   an encapsulating body covering at least part of the semiconductor chip, at least part of the at least two non-conductive tie bars and part of the lead frame.

2. The electronic component of claim 1, wherein the at least two metal joints are fully enclosed in the encapsulation body.

3. The electronic component of claim 1, wherein the at least two non-conductive tie bars are joined by a connective frame.

4. The electronic component of claim 3, wherein the connective frame comprises a rigid material.

5. The electronic component of claim 1, wherein a surface of the at least two non-conductive tie bars and a surface of the encapsulation compound form an outer surface of the electronic component.

6. The electronic component of claim 1, wherein the at least two non-conductive tie bars comprise a material with a melting point greater than 200 degrees Celsius.

7. The electronic component of claim 1, wherein the at least two non-conductive tie bars comprise a rigid material.

8. The electronic component of claim 1, wherein the plurality of conductive lead fingers are disposed at one side of the electronic component.

9. The electronic component of claim 1, wherein bottom portions of the at least two non-conductive tie bars enclose top portions of the at least two metal joints, respectively, and wherein the bottom portions and the top portions comprise meshing dents and/or protrusions that provide an increased contact region therebetween.

10. An electronic component, comprising:
    a lead frame including: a heat spreader area, a plurality of conductive lead fingers, at least one non-conductive tie bar, and at least one metal joint respectively connecting the at least one non-conductive tie bar to the heat spreader area, wherein a bottom portion of the at least one non-conductive tie bar encloses a top portion of the at least one metal joint;
    a semiconductor chip arranged on a die pad located on the heat spreader area; and
    an encapsulating body covering at least part of the semiconductor chip, at least part of the at least one non-conductive tie bar and part of the lead frame.

11. The electronic component of claim 10, wherein the at least one metal joint is fully enclosed in the encapsulation body.

12. The electronic component of claim 10, wherein the non-conductive tie bars are joined by a connective frame.

13. The electronic component of claim 12, wherein the connective frame comprises a rigid material.

14. The electronic component of claim 10, wherein a surface of the non-conductive tie bars and a surface of the encapsulation compound form an outer surface of the electronic component.

15. The electronic component of claim 10, wherein the non-conductive tie bar comprises a material with a melting point greater than 200 degrees Celsius.

16. The electronic component of claim 10, wherein the at least one non-conductive tie bar comprises a rigid material.

17. The electronic component of claim 10, wherein the conductive lead fingers are disposed at one side of the electronic component.

18. The electronic component of claim 10, wherein the bottom portion of the at least one non-conductive tie bar and the top portion of the at least one metal joint comprise meshing dents and/or protrusions that provide an increased contact region there between.

* * * * *